US008650446B2

(12) United States Patent
Byom et al.

(10) Patent No.: US 8,650,446 B2
(45) Date of Patent: Feb. 11, 2014

(54) MANAGEMENT OF A NON-VOLATILE MEMORY BASED ON TEST QUALITY

(75) Inventors: Matthew Byom, Campbell, CA (US);
Nir J. Wakrat, Los Altos, CA (US);
Kenneth Herman, San Jose, CA (US);
Daniel J. Post, Campbell, CA (US)

(73) Assignee: Apple Inc., Cupertino, CA (US)

( * ) Notice: Subject to any disclaimer, the term of this patent is extended or adjusted under 35 U.S.C. 154(b) by 843 days.

(21) Appl. No.: 12/730,551

(22) Filed: Mar. 24, 2010

(65) Prior Publication Data
US 2011/0239064 A1   Sep. 29, 2011

(51) Int. Cl.
*G11C 29/00* (2006.01)

(52) U.S. Cl.
USPC .......................... 714/723; 714/763

(58) Field of Classification Search
USPC .......................... 714/718, 723, 763
See application file for complete search history.

(56) References Cited

U.S. PATENT DOCUMENTS

| | | | |
|---|---|---|---|
| 4,570,217 A | 2/1986 | Allen et al. | |
| 6,631,086 B1 | 10/2003 | Bill et al. | |
| 6,813,678 B1 * | 11/2004 | Sinclair et al. | 711/103 |
| 6,823,507 B1 | 11/2004 | Srinivasan et al. | |
| 6,834,364 B2 * | 12/2004 | Krech et al. | 714/45 |
| 7,334,159 B1 | 2/2008 | Callaghan | |
| 7,447,869 B2 | 11/2008 | Kruger et al. | |
| 7,945,826 B2 | 5/2011 | Kameda et al. | |
| 8,041,882 B2 | 10/2011 | Jachalsky et al. | |
| 8,060,797 B2 | 11/2011 | Hida et al. | |
| 8,179,367 B2 | 5/2012 | Kitaura | |
| 8,255,773 B2 * | 8/2012 | D'Abreu et al. | 714/764 |
| 8,516,343 B2 * | 8/2013 | Flynn et al. | 714/773 |
| 2002/0124129 A1 | 9/2002 | Zilberman | |
| 2003/0084386 A1 * | 5/2003 | Barth et al. | 714/718 |
| 2006/0053357 A1 * | 3/2006 | Rajski et al. | 714/742 |
| 2006/0168475 A1 | 7/2006 | Segers et al. | |
| 2006/0200726 A1 * | 9/2006 | Gittins et al. | 714/763 |
| 2008/0052446 A1 | 2/2008 | Lasser et al. | |

(Continued)

FOREIGN PATENT DOCUMENTS

EP    0794484    9/1997

OTHER PUBLICATIONS

Mohammad, M.G.; Saluja, K.K.; , "Electrical model for program disturb faults in non-volatile memories," VLSI Design, 2003. Proceedings. 16th International Conference on , vol., No., pp. 217-222, Jan. 4-8, 2003.*

(Continued)

*Primary Examiner* — Cynthia Britt
(74) *Attorney, Agent, or Firm* — Van Court & Aldridge LLP

(57) ABSTRACT

Systems and methods are disclosed for managing a non-volatile memory ("NVM"), such as a flash memory. The NVM may be managed based on results of a test performed on the NVM. The test may indicate, for example, physical memory locations that may be susceptible to errors, such as certain pages in the blocks of the NVM. Tests on multiple NVMs of the same type may be compiled to create a profile of error tendencies for that type of NVM. In some embodiments, data may be stored in the NVM based on individual test results for the NVM or based on a profile of the NVM type. For example, memory locations susceptible to error may be retired or data stored in those memory locations may be protected by a stronger error correcting code.

11 Claims, 3 Drawing Sheets

(56) References Cited

U.S. PATENT DOCUMENTS

| | | |
|---|---|---|
| 2008/0209294 A1 | 8/2008 | Brink et al. |
| 2010/0122148 A1 | 5/2010 | Flynn et al. |
| 2010/0332949 A1* | 12/2010 | d'Abreu et al. ............... 714/766 |
| 2011/0010698 A1 | 1/2011 | Byom et al. |
| 2011/0161748 A1* | 6/2011 | Casper et al. ............... 714/708 |
| 2011/0239064 A1 | 9/2011 | Byom et al. |
| 2011/0252289 A1 | 10/2011 | Patapoutian et al. |

OTHER PUBLICATIONS

Chan Huan Gim; , "A novel bitmap analysis technique—test sensitivity intensity bitmap," Physical and Failure Analysis of Integrated Circuits, 2002. IPFA 2002. Proceedings of the 9th International Symposium on the , vol., No., pp. 105-109, 2002.*

Jim Cooke, "Micron® e-MMC™ Embedded Memory Simplifies High-Capacity Storage for Mobile and Embedded Systems," pp. 1-7, 2007 Micron Technology, Inc.

* cited by examiner

MANAGEMENT OF A NON-VOLATILE MEMORY BASED ON TEST QUALITY

FIELD OF THE INVENTION

This can relate to managing a non-volatile memory, such as flash memory, based on testing one or more non-volatile memories.

BACKGROUND OF THE DISCLOSURE

NAND flash memory, as well as other types of non-volatile memories ("NVMs"), are commonly used for mass storage. For example, consumer electronics such as portable media players or cellular telephones often include raw flash memory or a flash card to store music, videos, and other media.

Some non-volatile memories, such as NAND flash memory, may have memory locations that include initial defects or can develop defects through use. Also, data stored in usable memory locations may suffer from other error-causing phenomena, such as read disturb or charge retention issues. Thus, to ensure that data stored in these memory locations can be accurately retrieved, redundant information be computed and stored along with the data. For example, an error correcting code may be applied to the data prior its storage in the non-volatile memory.

SUMMARY OF THE DISCLOSURE

Systems and methods are disclosed for partitioning data for managing storage of data in a non-volatile memory, such as flash memory (e.g., NAND flash memory).

An electronic system may be provided which can include a host, such as a portable media player or a cellular telephone, and a non-volatile memory ("NVM") of any suitable type. For example, the non-volatile memory can include flash memory, such as one or more flash dies. Optionally, the NVM may be packaged with a NVM controller, and therefore the NVM may be a managed NVM (e.g., managed NAND) or a raw NVM (e.g., raw NAND). The host may include a host processor for controlling and managing the memory locations of the NVM and the data stored therein.

The NVM may be managed based on testing the NVM and/or testing other NVMs of the same type. As used herein, NVMs of the same "type" may refer to NVMs that are manufactured using substantially the same manufacturing process, have substantially the same specifications (e.g., in terms of materials used, capacity, dimensions, and the like), or are assigned the same part number by the NVM manufacturer. By testing one or more NVMs of the same type, physical memory locations that may be more susceptible to error-causing phenomena may be identified. For example, if each block of an NVM includes a sequence of pages, the test results may indicate which page(s) in the sequence tended to fail the test more often than other pages. These pages may be identified as being more susceptible to error or error-causing phenomena.

In some embodiments, a profile for a particular type of NVM may be created. The profile may combine test results from multiple NVMs of the particular type to obtain a general error pattern or trend for the NVM. This way, even if testing a specific NVM does not provide sufficient information about the error patterns of the NVM, the profile may be used to determine how to manage the NVM. In other embodiments, a specific NVM may be managed based just on testing the specific NVM, or from a combination of testing the specific NVM and the associated profile.

A host processor and/or NVM controller may be configured to manage a NVM based on test results or the profile. For example, the host processor and/or NVM controller may be configured to retire memory locations (e.g., pages) that are more susceptible to error, use a more reliable storage technique on data stored in memory locations that are more susceptible to error (e.g., applying a stronger error correcting code, using fewer number of bits per cell, more finely tuning the amount of charge stored in each cell, etc.), may store less critical data in memory locations that are more susceptible to error, may use the more susceptible memory locations for storing specific types of data (e.g., extra error correcting code (ECC) data), or any combination of the above.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which.

DETAILED DESCRIPTION OF THE DISCLOSURE

Figure 1:
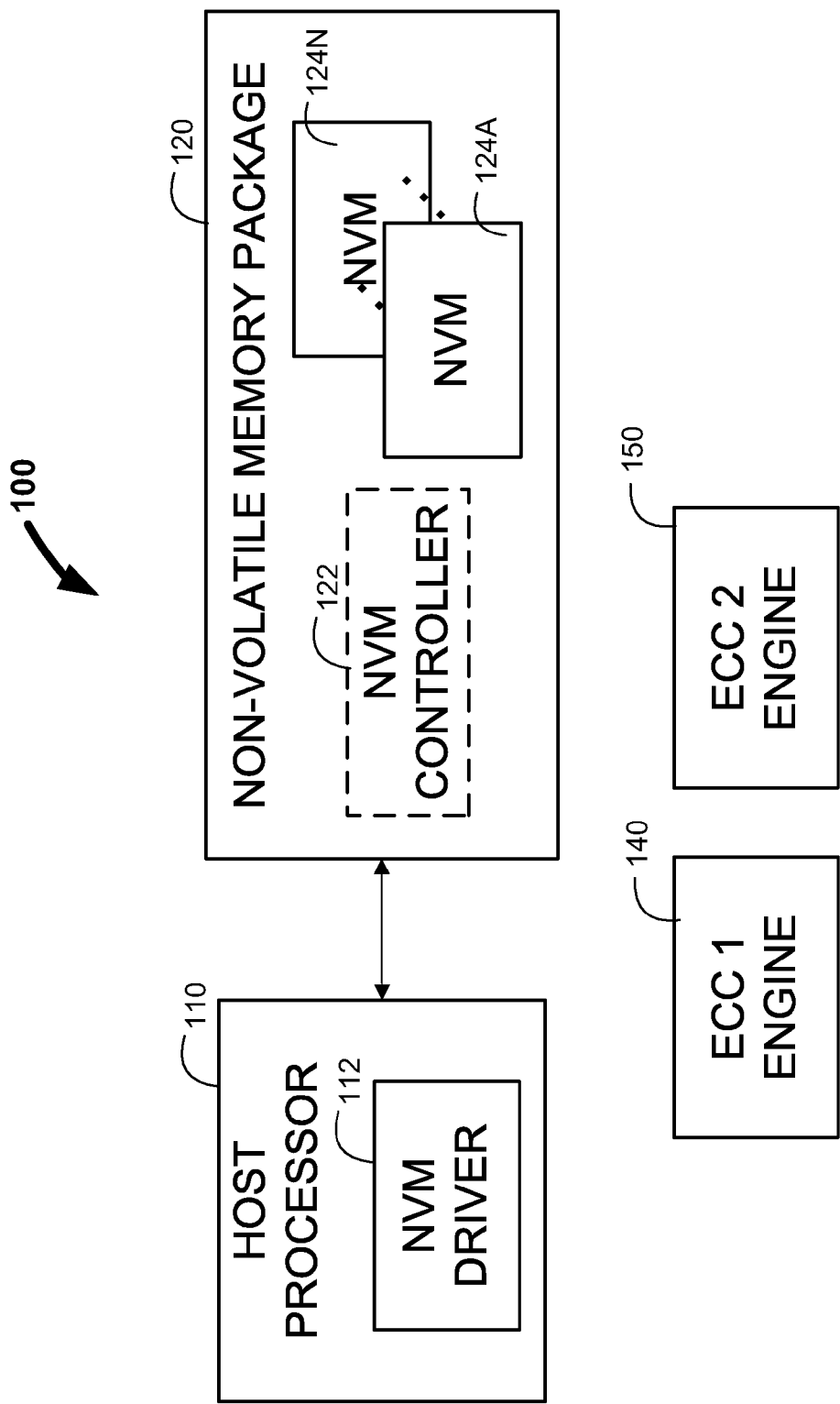
FIG. 1 is a schematic view of an illustrative memory system including a host processor and a non-volatile memory package configured in accordance with various embodiments of the invention.

FIG. 1 is a schematic view of memory system 100. Memory system 100 can include host processor 110, at least one non-volatile memory ("NVM") package 120, and error correction code ("ECC") engines 140 and 150. Host processor 110 and optionally NVM package 120 and ECC engines 140 and 150 can be implemented in any suitable host device or system, such as a portable media player (e.g., an iPod™ made available by Apple Inc. of Cupertino, Calif.), a cellular telephone (e.g., an iPhone™ made available by Apple Inc.), a pocket-sized personal computer, a personal digital assistance ("PDA"), a desktop computer, or a laptop computer. For simplicity, the host device or system, which may include host processor 110, may sometimes be referred to simplicity as a "host."

Host processor 110 can include one or more processors or microprocessors that are currently available or will be developed in the future. Alternatively or in addition, host processor 110 can include or operate in conjunction with any other components or circuitry capable of controlling various operations of memory system 100 (e.g., application-specific integrated circuits ("ASICs")). In a processor-based implementation, host processor 110 can execute firmware and software programs loaded into a memory (not shown) implemented on the host. The memory can include any suitable type of volatile memory (e.g., cache memory or random access memory ("RAM"), such as double data rate ("DDR") RAM or static RAM ("SRAM")). Host processor 110 can execute NVM driver 112, which may provide vendor-specific and/or technology-specific instructions that enable host processor 110 to perform various memory management and access functions for non-volatile memory package 120.

NVM package 120 may be a ball grid array ("BGA") package or other suitable type of integrated circuit ("IC") package. NVM package 120 may be a managed NVM package or a raw NVM package. In a managed NVM implementation, NVM package 120 can include NVM controller 122 coupled to any suitable number of NVM dies 124A-124N. NVM controller 122 may include any suitable combination of processors, microprocessors, or hardware-based components (e.g., ASICs), and may include the same components as or different components from host processor 110. NVM controller 122 may share the responsibility of managing and/or accessing the physical memory locations of NVM dies 124A-124N with NVM driver 112. Alternatively, NVM controller 122 may perform substantially all of the management and access functions for NVM dies 124A-124N. Thus, a "managed NVM" may refer to a memory device or package that includes a controller (e.g., NVM controller 122) configured to perform at least one memory management function for a non-volatile memory (e.g., NVM dies 124A-124N).

In a managed NVM implementation, host processor 110 can communicate with NVM controller 122 using any suitable communications protocol, such as a suitable standardized inter-processor protocol. For example, NVM package 120 may be included in a memory card (e.g., flash card), and host processor 110 and NVM controller 122 may communicate using Multimedia Memory Card ("MMC") or Secure Digital ("SD") card interfaces. In other embodiments, NVM package 120 may be included in a Universal Serial Bus ("USB") memory drive, and host processor 110 and NVM controller 122 may communicate via a USB protocol.

In some embodiments, non-volatile memory package 120 may be a raw NVM package. In these embodiments, NVM package 120 may not include NVM controller 122, and NVM dies 124A-124N may be managed substantially completely by host processor 110 (e.g., via NVM driver 112). Thus, a "raw NVM" may refer to a memory device or package that may be managed entirely by a host controller or processor (e.g., host processor 110) implemented external to the NVM package. To indicate that, in some embodiments, an NVM controller 122 may not be included in NVM package 120, NVM controller 122 is depicted in FIG. 1 with dotted lines.

NVM dies 124A-124N may be used to store information that needs to be retained when memory system 100 is powered down. As used herein, and depending on context, a "non-volatile memory" can refer to NVM dies or devices in which data can be stored, or may refer to a NVM package that includes the NVM dies. NVM dies 124A-124N can include NAND flash memory based on floating gate or charge trapping technology, NOR flash memory, erasable programmable read only memory ("EPROM"), electrically erasable programmable read only memory ("EEPROM"), ferroelectric RAM ("FRAM"), magnetoresistive RAM ("MRAM"), any other known or future types of non-volatile memory technology, or any combination thereof. FIG. 1, as well as later figures and various disclosed embodiments, may sometimes be described in terms of using flash technology. However, this is merely illustrative and not intended to be limiting.

The memory locations in NVM dies 124A-124N can be organized into one or more "planes." The different planes can concurrently carry out access operations to its memory locations (e.g., program, read, and erase operations). The memory locations of each plane may be organized into "blocks" that may each be erasable at once, with its blocks further organized into "pages" that may each be programmable and readable at once. The blocks from corresponding NVM dies 124A-124N (e.g., one block from each NVM die having the same position or block number) may form logical storage units referred to as "super blocks." NVM dies 124A-124N may include any suitable number of planes, blocks, and pages. For example, in some embodiments, each NVM die 124 may include two planes, where each plane can include 2048 blocks, each block may include 64, 128, or 192 pages based on whether the block is an SLC block, 2-bit MLC block, or 3-bit MLC block, and each page can include 512 bytes. These numbers, however, are merely illustrative and are not intended to be limiting.

Memory system 100 can include multiple ECC engines, including at least ECC engines 140 and 150. ECC engines 140 and 150 can each employ one or more error correcting or error detecting codes, such as a Reed-Solomon ("RS") code, a Bose, Chaudhuri and Hocquenghem ("BCH") code, a cyclic redundancy check ("CRC") code, or any other suitable error correcting or detecting code. ECC engines 140 and 150 may be used to protect data that is stored in non-volatile memory dies 124A-124N, and therefore the type and strength of ECC engines 140 and 150 may be selected based on the properties and reliability of NVM dies 124A-124N.

ECC engines 140 and 150 may have different "strengths." The "strength" of an ECC may indicate the maximum number of errors (e.g., bit flips) that may be corrected by the ECC. In some embodiments, ECC engine 140 may employ an error correcting code able to correct up to t errors (and detect even more than t errors), and ECC engine 150 may employ a different error correcting code able to correct more than t errors. Data protected using ECC engine 150 may therefore be more resilient to effects of error-causing phenomena (e.g., program disturb, charge loss, etc.) than data protected by using ECC engine 140. Accordingly, host processor 110 and/or NVM controller 122 may choose between using ECC engines 140 and 150 to achieve a desired reliability. In other embodiments, as another way to achieve different degrees of protection, host processor 110 and/or NVM controller 122 may be configured to apply both ECC engines 140 and 150 on some data (e.g., as inner and outer codes, respectively) and only one of ECC engines 140 and 150 on other data. As discussed in greater detail below, it should be understood that host processor 110 and/or NVM controller 122 can use any suitable technique to provide different degrees of protection, including but not limited to applying different amounts of error correction.

ECC engines 140 and 150 may be implemented using any suitable software-based or hardware-based approach. For example, in some embodiments, ECC engines 140 and 150 may be software modules executed by host processor 110 or by NVM controller 122. In other embodiments, ECC engines 140 and 150 may be implemented using hardware (e.g., an ASIC), such as using one or more linear feedback shift registers ("LFSRs"). The ECC hardware may be included in NVM package 120 for access and use by NVM controller 122. Alternatively, the ECC hardware may be included with and accessed by host processor 110, and ECC engines 140 and 150 may be included on the same substrate as host processor 110 (e.g., on a system-on-a-chip ("SOC")). While memory system 100 is illustrated as having two ECC engines, it should be understood that memory system 100 can include any suitable number of ECC engines.

As discussed above, host processor 110 (e.g., via NVM driver 112) and optionally NVM controller 122 may be configured to perform memory management and access functions for NVM dies 124A-124N. This way, host processor 110 and/or NVM controller 122 can manage the memory locations (e.g., super blocks, pages, blocks, and planes) of NVM dies 124A-124N and the information stored therein. The memory management and access functions may include issuing read, write, or erase instructions and performing wear leveling, bad block management, garbage collection, logical-to-physical address mapping, SLC or MLC programming decisions, applying error correction or detection using ECC engines 140 and 150, and data queuing to set up program operations.

Host processor 110 and/or NVM controller 122 may be configured to manage a non-volatile memory (here, NVM dies 124A-124N) based on testing one or more non-volatile memories. The test may be run during the manufacturing process of memory system 100 or a host device, such as prior to the shipment of memory system 100 for use by an end user (e.g., a consumer or purchaser of memory system 100). Host processor 110 and/or NVM controller 122 may run any suitable type of test to assess the "quality" of the physical memory locations in the non-volatile memory. The "quality" of a memory location may refer to an estimate of the memory location's ability to retain any data stored therein. For example, a memory location more susceptible to disturb issues (e.g., read disturb) may have a lower quality than memory locations less susceptible to these issues.

In some embodiments, host processor 110 and/or NVM controller 122 may run a suitable test on the non-volatile memory to identify which pages in each block failed a test. To test a particular page, for example, host processor 110 and/or NVM controller 122 may program a known pattern into the page, read the page back out, and verify that the read data matches the known pattern. For simplicity, this type of test on a page may be referred to sometimes as a "program-verify" test. In some embodiments, the test may be the same or similar to any of the tests discussed in co-pending, commonly-assigned U.S. patent application Ser. No. 12/502,128, filed Jul. 13, 2009 and entitled "TEST PARTITIONING FOR A NON-VOLATILE MEMORY," which is hereby incorporated herein in its entirety.

Figure 2:
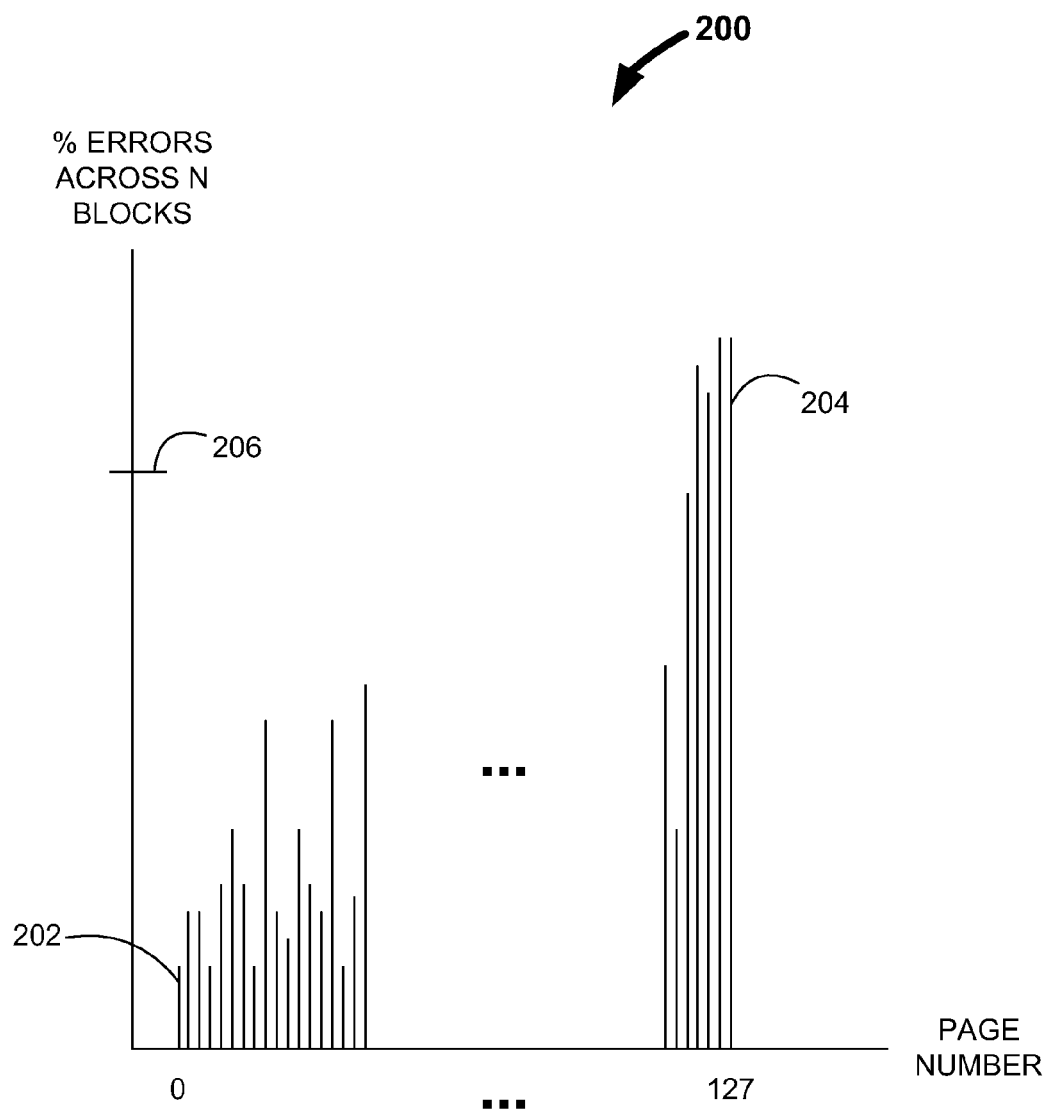
FIG. 2 is a bar graph of test results indicating page quality for one or more non-volatile memories in accordance with various embodiments of the invention.

FIG. 2 is a bar graph 200 of results of an illustrative test that host processor 110 and/or NVM controller 122 may perform on a non-volatile memory, such as a flash memory. The x-axis can list a sequence of pages in a block. In this example, at least one block may include 128 pages, and the 128 pages represented along the x-axis may be located in the block from position 0 through position 127. The y-axis can indicate a percentage (i.e., between 0% and 100%) failing the test. Bar 202, for example, may illustrate the percentage of blocks with corresponding pages at position 0 failing the test, while bar 204 may illustrate the percentage of these blocks that with corresponding pages at position 127 failing the test.

FIG. 2 illustrates one way in which test results may be compiled and post-processed to generate error statistics. The post-processing may be performed by host processor 110 and/or NVM controller 122, or the post-processing may be performed by a computer or other system external to memory system 100. By generating failure statistics, patterns of failure may be identified and used in managing the non-volatile memory. In the example of FIG. 2, generating graph 200 may reveal a pattern indicating that pages near the end of a block (e.g., pages 125, 126, and 127) may be more susceptible to error-causing phenomena, such as read/program/erase disturb issues, than other pages. Thus, FIG. 2 illustrates one way in which the quality of memory locations may be determined.

In some embodiments, the error statistics generated by post-processing the test results may be used to identify particular memory locations (e.g., pages) that may be more susceptible to error or error-causing phenomena. For example, the percentages of FIG. 2 may be compared to a predetermined threshold, such as predetermined threshold 206. The pages with error percentages above threshold 206, such as pages 124, 125, 126, and 127, may be identified as being susceptible to error. For simplicity, such memory locations may be referred to as "low quality" memory locations. The pages with error percentages below threshold 206 may be identified as not being particularly susceptible to error. Such memory locations may sometimes be referred to as "high quality" memory locations. In these embodiments, host processor 110 and/or NVM controller 122 may be configured to treat pages 0-123 of some or all of the blocks in NVM dies 124A-124N as high quality and pages 124-127 of these blocks as low quality.

It should be understood that any other suitable technique may be used to quantitatively distinguish high quality memory locations from low quality memory locations. For example, instead of comparing the error percentages to a threshold, a predetermined number of pages associated with the highest error percentages may be identified as low quality pages, while the remaining pages may be identified as high quality. Alternatively, error percentages or other such error statistics may not be calculated at all, and memory locations that failed the test may be identified as low quality pages. In these embodiments, a different number and a different set of pages may be allocated as low quality pages for different blocks in a non-volatile memory.

In embodiments where error statistics are used to distinguish between high and low quality memory locations, test results for any suitable number of non-volatile memories may be used to generate the error statistics. In some embodiments, results from testing the current non-volatile memory location (i.e., NVM dies 124A-124N) may be the only test results used to generate error statistics. In other words, host processor 110 and/or NVM controller 122 may be configured to manage NVM dies 124A-124N using only the test results for NVM dies 124A-124N. In these embodiments, graph 200 of FIG. 2 may reflect the error percentages taken from some or all of the blocks of NVM dies 124A-124N, and low quality memory locations may be distinguished from high quality memory locations using just the error trends and tendencies of the current non-volatile memory.

In other embodiments, the error statistics may be calculated based on testing multiple non-volatile memories of the same type. As discussed above, NVMs of the same "type" may refer to NVMs that are manufactured using substantially the same manufacturing process, have substantially the same specifications (e.g., in terms of materials used, capacity, dimensions, and the like), or are assigned the same part number by the NVM manufacturer. Because NVMs of the same type may apply the same technology or be manufactured from the same process, these NVMs may have similar error tendencies and patterns. Test results from multiple of these non-volatile memories may therefore be compiled to create an accurate, big picture of which memory locations may be more susceptible to error across many similarly constructed non-volatile memories. These error tendencies may be presumed to apply to other non-volatile memories of the same type, and therefore the error tendencies of NVM dies 124A-124N may be approximated from the compiled test results instead of having to test NVM dies 124A-124N themselves.

Test results from multiple non-volatile memories of the same type may be compiled to create a profile for that particular type of non-volatile memory. The profile may include, for example, information on which memory locations (e.g., pages in a block) may be low quality and which memory locations may be high quality. To keep the profile up-to-date, the profile may be updated as additional non-volatile memories of the particular type are tested by a device manufacturer. The profile may be used to configure a memory system that uses a non-volatile memory having the particular type, such as host processor 110 and/or NVM controller 122 of memory system 100. Thus, if memory system 100 is compatible for use with multiple types of non-volatile memories (e.g., from multiple NVM suppliers), a profile for each such type may be maintained. Host processor 110 and/or NVM controller 122 may be configured by identifying the profile associated with the non-volatile memory being implemented in the current memory system 100, and then performing the configuration based on the profile.

As discussed above, host processor 110 and/or NVM controller 122 may be configured to manage a non-volatile memory based on the test results, NVM profiles, and/or any other error statistics obtained from post-processing NVM test results. Host processor 110 and/or NVM controller 122 may be configured during the manufacturing process of memory system 100 or host device. For example, host processor 110 and/or NVM controller 122 may tailor or adjust one or more of the above-discussed memory access and management functions based on the test results, error statistics, or NVM profile. As described in greater detail below, host processor 110 may manage low quality memory locations (and any information stored therein) using a storage technique different from that used to manage high quality memory locations (and any information stored therein).

In some embodiments, host processor 110 and/or NVM controller 122 may retire memory locations that may be susceptible to error (i.e., low quality memory locations). For example, responsive to analyzing the error statistics of FIG. 2, host processor 110 and/or NVM controller 122 may be configured so that pages 124, 125, 126, and 127 in each block of a non-volatile memory may not be used. This way, the pages that may be most likely to generate errors can be avoided.

In some embodiments, host processor 110 and/or NVM controller 122 may be configured to use a more reliable storage technique for lower quality memory locations than for higher quality pages. For example, host processor 110 and/or NVM controller 122 may use a stronger error correcting code ("ECC") on data that will be stored in memory locations that may be more susceptible to error. In these embodiments, for example, if ECC engine 150 is associated with a stronger ECC than ECC engine 140, ECC engine 150 may be applied to data stored in low quality memory locations, while ECC engine 140 may be applied to data stored in high quality memory locations. Alternatively, host processor 110 and/or NVM controller 122 may use different storage techniques by using a different number of bits per cell. Because increasing the number of bits per cell may decrease the reliability of storage, less bits per cell (e.g., SLC) may be used for low quality memory locations than for high quality memory locations (e.g., MLC).

As still another example, host processor 110 and/or NVM controller 122 may use different storage techniques by more finely tuning charges stored in the susceptible memory locations. That is, when programming low quality memory locations, host processor 110 and/or NVM controller 122 may use more time or energy to ensure that the desired amount of charge is stored in the memory cells. This way, the low quality memory locations may be less susceptible to error from disturb issues.

In some embodiments, host processor 110 and/or NVM controller 122 may be configured to store more critical data in higher quality memory locations. For example, host processor 110 and/or NVM controller 122 may assign the data a priority (e.g., a "high" priority or a "low" priority) and may ensure that high priority data is not stored in lower quality memory locations. The priority may be based on any suitable factor or combination of factors, such as how recoverable the data is (e.g., based on the ease in which a system can reconstruct or re-obtain the data, such as from a server or whether the data is personalized to a specific user) and/or how critical the data is to the operation of the system.

In some embodiments, host processor 110 and/or NVM controller 122 may be configured to store particular types of information in the low quality memory locations (e.g., pages 124, 125, 126, and 127 of each block in the example of FIG. 2), or to avoid storing particular types of information in the low quality memory locations. For example, the low quality memory locations may be used to store user data, while metadata necessary for managing the non-volatile memory may be stored in the high quality memory locations. As another example, low quality memory locations may be reserved for storing extra ECC data. Some ECC metadata may be stored with user data in high quality memory locations. This may afford the user data a limited amount of initial resiliency to errors (for error correcting codes) or to provide error detection capabilities (for error detecting codes). Extra ECC metadata may be stored in the low quality memory locations so that, if the limited amount of initial protection is not sufficient, the extra ECC metadata may be used to recover the user data.

Figure 3:
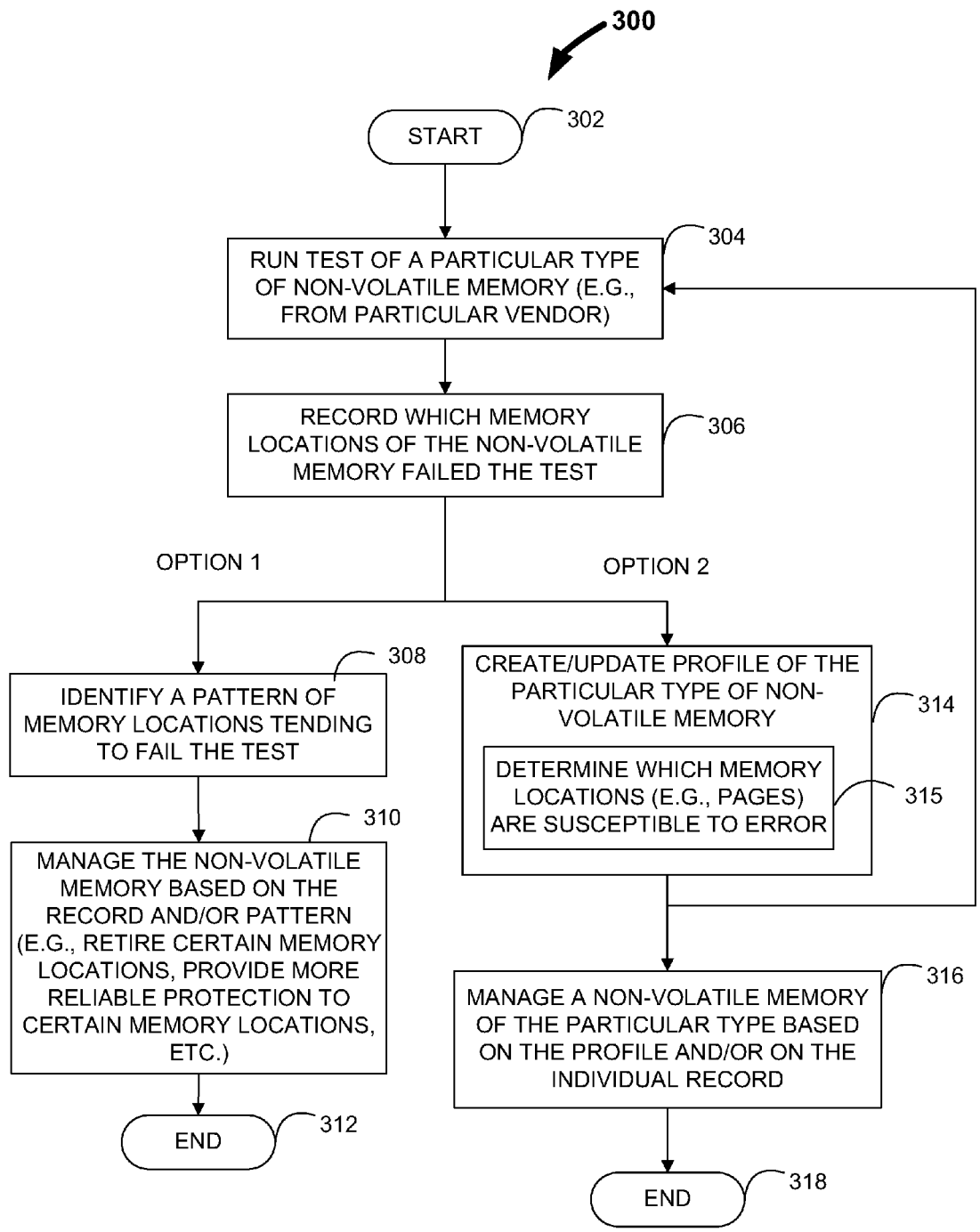
FIG. 3 is a flowchart of an illustrative process for managing a non-volatile memory based on test quality in accordance with various embodiments of the invention.

Referring now to FIG. 3, a flowchart of illustrative process 300 is shown in accordance with various embodiments of the invention. Process 300 may be executed by one or more components in a memory system (e.g., memory system 100 of FIG. 1) to manage a non-volatile memory based on test quality. For example, host processor 110 and/or NVM controller 122 may perform the steps of process 300, and process 300 may sometimes be described as such, but it should be understood that any other suitable component(s) in a memory system may be configured to perform these steps.

Process 300 may begin at step 302. Then, at step 304, a test may be performed on a particular type of non-volatile memory. The test performed at step 302 may be similar to any of the tests discussed in the above-incorporated U.S. patent application Ser. No. 12/502,128, and the results may indicate, for example, specific memory locations (e.g., pages) in the non-volatile memory that failed the test. Thus, at step 306, the memory locations of the non-volatile memory that failed the test may be recorded.

Host processor 110 and/or NVM controller 122 may take any suitable steps following step 306 to utilize the test results. Process 300 illustrates two such options. For example, as a first option, process 300 may move from step 306 to step 308. At step 308, host processor 110 or NVM controller 122 may identify a pattern of memory locations that tended to fail the test run at step 304. For example, host processor 110 and/or NVM controller 122 may compile error statistics similar to the error percentages illustrated in FIG. 2 for the blocks in the tested non-volatile memory. This way, host processor 110 and/or NVM controller 122 may identify a pattern of which page or set of pages in each block of the tested non-volatile memory tended to fail the test (in absolute numbers or relative to other pages in the non-volatile memory). The page or set of pages identified at step 308 may have lower quality and may be more susceptible to errors.

Continuing to step 310, host processor 110 and/or NVM controller 122 may manage the memory locations of the non-volatile memory. The management may be based on the recorded test results or on the pattern identified at step 308. In other words, host processor 110 and/or NVM controller 122 may use the results of the test run on a specific non-volatile memory in order to manage the memory locations of that same non-volatile memory. For example, as discussed above, host processor 110 and/or NVM controller 122 may be configured to retire memory locations that failed the test performed at step 304, use a more reliable storage technique on memory locations that failed the test (e.g., by applying a stronger error correcting code, using fewer number of bits per cell, more finely tuning the amount of charge stored in each cell, etc.), store less critical data or specific types of data/metadata in memory locations that failed the test, or any combination thereof. If the non-volatile memory is managed this way (i.e., not based on the pattern identified at step 308), step 308 may be skipped altogether.

Alternatively, host processor 110 and/or NVM controller 122 may use the pattern identified at step 308 to manage the non-volatile memory. For example, the pattern may be used by retiring memory locations that tended to fail the test based on the pattern, using a more reliable storage technique on memory locations that tended to fail the test based on the pattern, storing less critical data or specific types of data/metadata in memory locations that tended to fail the test based on the pattern, or any combination thereof. Process 300 may then move to step 312 and end.

Returning to step 306, as a second option, process 300 may move from step 306 to step 314. At step 314, a profile for the non-volatile memory may be created or updated based on the recorded test results. The profile may be associated with non-volatile memories of the particular type (i.e., non-volatile memories with the same part number, non-volatile memories created using the same manufacturing process, etc.). The profile may combine results from tests of different non-volatile memories of the same type. For example, the profile may include error statistics similar to that illustrated in bar graph 200 of FIG. 2, where the blocks that are analyzed may be taken from multiple non-volatile memories of the same type. Therefore, step 314 can include step 315 of determining which memory locations (e.g., pages) of similar non-volatile memories may be prone or more susceptible to errors. In some embodiments, for example, host processor 110 and/or NVM controller 122 can identify a pattern of physical memory locations (e.g., pages) tending to fail their respective tests, as discussed above in connection with step 308. The pattern may be based on analyzing the test results from multiple non-volatile memories of the same type instead of just one. The profile created or updated at step 314 may include any of the information determined at step 314.

From step 314, process 300 may iterate one or more times back to step 304 so that one or more additional tests may be performed on other non-volatile memories of the same type. This way, results of the additional tests performed on these iterations may be used to update the profile at step 314. The profile may therefore be continually updated, which may increase the accuracy of the profile.

From step 314, process 300 may also continue to step 316. At step 316, host processor 110 and/or NVM controller 122 may manage a non-volatile memory of the particular type. For example, host processor 110 and/or NVM controller 122 may manage the storage of data in the memory locations of the non-volatile memory, or the way in which the memory locations may be accessed in general. The non-volatile memory managed at step 316 may or may not be the non-volatile memory that was tested at step 304. Host processor 110 and/or NVM controller 122 may manage the non-volatile memory based on the profile created or updated at step 314 and/or on the test run at step 304. For example, as discussed above, host processor 110 and/or NVM controller 122 may be configured to retire memory locations that the profile indicates may be susceptible to errors, use a more reliable storage technique on memory locations that may be more susceptible to errors, store less critical data or specific types of data/metadata in memory locations that may be more susceptible to errors, or any combination of the above. Process 300 may then move to step 318 and end.

It should be understood that process 300 is merely illustrative. Any of the steps may be removed, modified, or combined, and any additional steps may be added, without departing from the scope of the invention.

The described embodiments of the invention are presented for the purpose of illustration and not of limitation.

What is claimed is:

1. A method of configuring a memory system comprising a non-volatile flash memory, the method comprising:
   performing a test on a plurality of physical memory locations in a flash non-volatile memory, wherein the flash non-volatile memory comprises multiple dies, each die comprises a plurality of blocks and each block comprises a plurality of pages, and wherein results of the test indicate which of the physical memory locations failed the test;
   identifying, from the results, a pattern of physical memory locations tending to fail the test, wherein the pattern shows at least one page number common to each block of at least one die that includes a percentage of same page failures that exceeds a predetermined threshold; and
   managing the physical memory locations of the non-volatile memory based on the pattern.

2. The method of claim 1, wherein the test is performed during a manufacturing process of the memory system.

3. The method of claim 1, Wherein the managing comprises configuring the memory system to access the non-volatile memory based on the pattern.

4. The memory system of claim 3, wherein the configuring is performed during a manufacturing process of the memory system.

5. The method of claim 1, wherein the managing comprises configuring the memory system to store data in the non-volatile memory based on the pattern.

6. The method of claim 5, wherein the configuring comprises at least one of: retiring at least a portion of the physical memory locations based on the pattern, applying error correction to data being stored in the non-volatile memory based on the pattern, determining a number of bits per cell to use for particular physical memory locations based on the pattern, and storing particular types of data at particular physical memory locations in the non-volatile memory based on the pattern.

7. The method of claim 1, wherein the non-volatile memory comprises flash memory.

8. A non-volatile Flash memory system, comprising:
   at least one Flash die, each die comprises a plurality of blocks and each block comprises a plurality of pages; and
   a controller operative to:
      perform a test on the at least one Flash die, wherein results of the test indicate which pages failed the test;
      identify, from the results, a pattern of persistent page failure across a predetermined number of blocks of the at least one die, wherein the pattern includes at least one page number common to each block that includes a percentage of same page failures that exceeds a predetermined threshold; and
      manage the at least one Flash die based on the pattern.

9. The non-volatile Flash memory system of claim 8, wherein the persistent page failure corresponds to the same page in each block.

10. The non-volatile Flash memory system of claim 8, wherein the at least one die comprises a plurality of dies, wherein the persistent page failure corresponds to the same page of the same block in each die.

11. A non-volatile Flash memory system, comprising:
- at least one Flash die, each die comprises a plurality of blocks and each block comprises a plurality of pages; and
- a controller operative to:
    - perform a test on the at least one Flash die, wherein results of the test indicate which pages failed the test;
    - identify, from the results, a pattern of consistent failures across a predetermined number of blocks of the at least one die; and
    - manage the at least one Flash die based on the pattern such that blocks included in the pattern are managed as relatively lower level cell non-volatile memory and blocks not included in the pattern are managed as relatively higher level cell non-volatile memory.

* * * * *

UNITED STATES PATENT AND TRADEMARK OFFICE
CERTIFICATE OF CORRECTION

PATENT NO. : 8,650,446 B2
APPLICATION NO. : 12/730551
DATED : February 11, 2014
INVENTOR(S) : Matthew Byom et al.

Page 1 of 1

It is certified that error appears in the above-identified patent and that said Letters Patent is hereby corrected as shown below:

In The Claims

In Column 10, Line 31, Claim 3, delete "Wherein" and insert -- wherein --, therefor.

Signed and Sealed this
Sixteenth Day of February, 2016

Michelle K. Lee
*Director of the United States Patent and Trademark Office*